United States Patent [19]

Perretta et al.

[11] Patent Number: 5,170,323
[45] Date of Patent: Dec. 8, 1992

[54] ELECTRICAL COMPONENT CLAMPING AND THERMAL TRANSFER DEVICE

[75] Inventors: Frederick A. Perretta, Huntington; Ross M. Grant, Shelton, both of Conn.

[73] Assignee: United Technologies Corporation, Hartford, Conn.

[21] Appl. No.: 731,827

[22] Filed: Jul. 16, 1991

[51] Int. Cl.⁵ .............................................. H05H 7/20
[52] U.S. Cl. .................... 361/386; 165/80.3; 165/185; 361/388; 361/417; 361/420
[58] Field of Search .............. 165/80.3, 185; 357/79, 357/81; 361/331, 346, 380, 386, 388, 417, 419, 420, 427

[56] References Cited

U.S. PATENT DOCUMENTS

| | | | |
|---|---|---|---|
| 2,668,933 | 2/1954 | Shapiro | 361/386 |
| 2,808,576 | 10/1957 | Brown | 361/386 |
| 4,613,925 | 9/1986 | Mohri et al. | 361/386 |

Primary Examiner—Gregory D. Thompson
Attorney, Agent, or Firm—Russell M. Lipes, Jr.

[57] ABSTRACT

A metallic clamp for an electrical component which rigidly supports the component and its connecting leads in a control panel so that they vibrate in unison in response to oscillations of the panel structure thereby preventing embrittlement and failure of the component leads. The metallic construction of the clamp serves as a heat sink and aids in the transfer of heat within the panel.

4 Claims, 1 Drawing Sheet

ELECTRICAL COMPONENT CLAMPING AND THERMAL TRANSFER DEVICE

This invention was made with Government support under a contract awarded by the U.S. Navy. The Government has certain rights in the invention.

DESCRIPTION

1. Technical Field

This invention relates to the support of electrical components particularly in aircraft control panels and the provision of a heat sink for the transfer of thermal energy.

2. Background Art

Electrical components used in aircraft control panels typically are supported or mounted on a printed wiring board in the control panel in U-shaped spring clips. Also, string ties, adhesives and conformal coatings are used to hold the component in place. The spring clip method of support is not satisfactory because it is not a rigid support of the component and allows relative movement of the component and its terminals. When this condition exists, the leads of the component will ultimately break. In fact, the leads on large components in aircraft control panels frequently break during qualification programs and also field use. String ties may not get tied properly at assembly with the result that the component may be loose. The removal of a failed component which has been attached by the use of an adhesive could cause damage to the printed wiring board. Further, the current component holding devices do not serve as heat sinks.

DISCLOSURE OF THE INVENTION

An object of the present invention is the provision of a rigid mount for electrical components in an aircraft control panel which keeps the component and the connection of its leads in the same relative plane when under the shock and vibrations associated with operating conditions.

Another object of the invention is the provision of a mount for an electrical component in an aircraft control panel which causes both the component and its connecting leads to vibrate in unison due to vibratory oscillation of the control panel structure and also serves as a heat sink for the transfer of thermal energy.

BEST MODE FOR CARRYING OUT THE INVENTION

Figure 1:
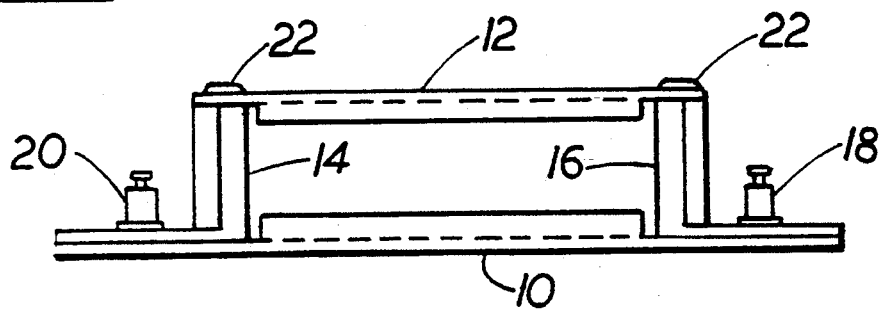
FIG. 1 is a side view of the component clamp of this invention in assembled form.

The component clamp shown in FIG. 1 includes bottom plate 10, top plate 12, L-shaped end brackets 14 and 16, and insulated standoffs or terminals 18 and 20 on the base or leg portion of the end brackets. Top plate 12 is attached to end brackets 14 and 16 by screws 22.

Figure 2:
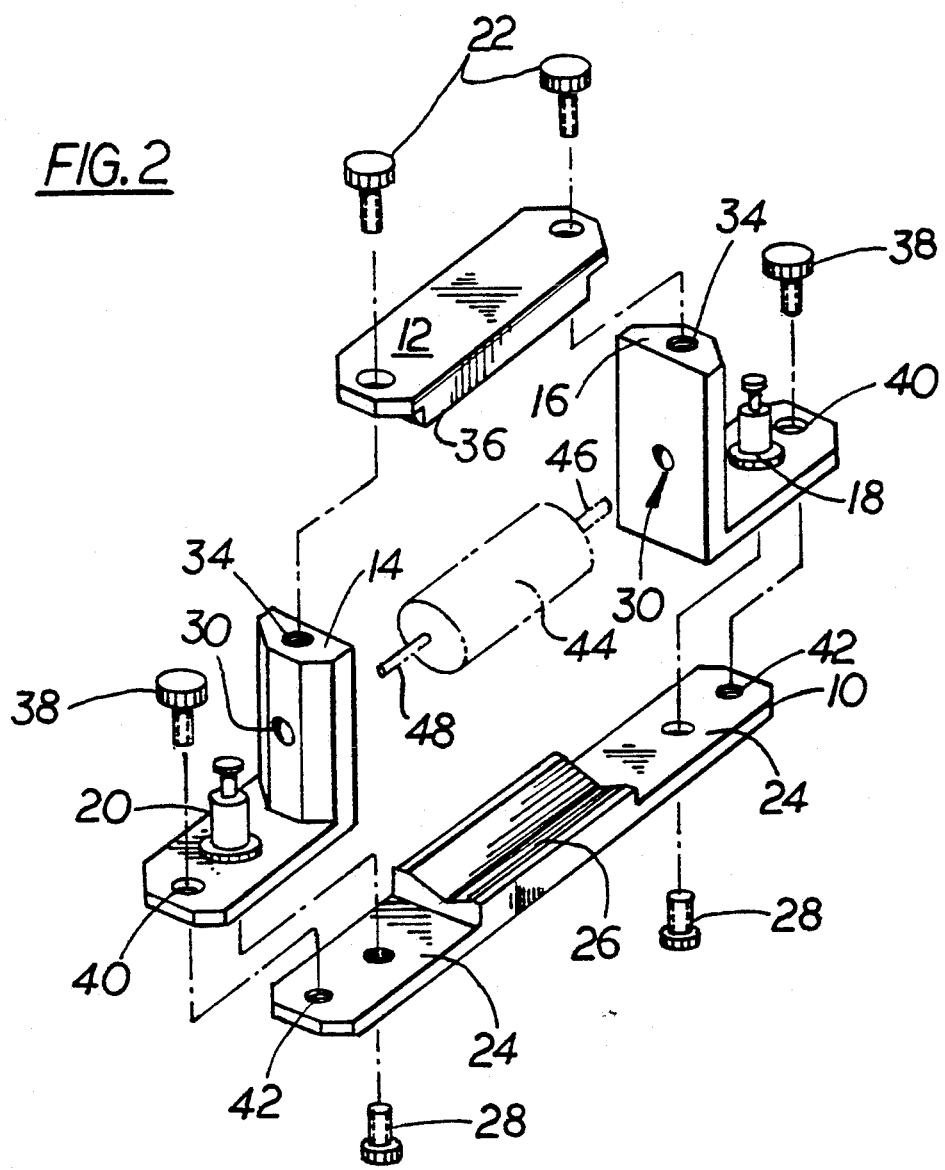
FIG. 2 is an exploded view of the component clamp.

FIG. 2 shows the component clamp and its associated connecting screws in exploded form. Bottom plate 10 has flat surfaces 24 on its upper face at either end and V-shaped channel 26 formed on the upper face between the flat surfaces. End brackets 14 and 16 are mounted on flat surfaces 24 and held in place by self-locking screws 28 which extend upward through bottom plate 10 and into terminals 18 and 20 Each end bracket has apertures 30 extending through its upright portion through which leads from the component held by the clamp extend for connection with terminals 18 and 20. The apertures are sized to preclude electrical contact with the component leads. Top plate 12 is attached to the end brackets by screws 22 which thread into self-locking inserts 34 on the top surface of the upright portion of each end bracket. The top plate has V-shaped surface 36 on its lower face in the area opposite channel 26 on bottom plate 10. The assembled bottom plate, top plate and end brackets are attached to the control panel in which the clamp is mounted by mounting screws 38 which extend through openings 40 in the end brackets and 42 in the bottom plate.

Electrical component 44 which is shown in phantom in FIG. 2 would be mounted in the clamp between V-shaped channels 26 and 36. A rubber pad, not shown, would be installed between the component and top plate channel 26 to assure sufficient pressure to hold the component securely in place without damaging it, regardless of overall diameter due to tolerances. The thickness of the rubber is calculated to prevent cold flow of the rubber.

Connecting leads 46 and 48 on the component are covered by an insulating sleeve and extend through the end bracket apertures for connection to their respective terminals 18 and 20. Control panel wiring for the component is also connected to the terminals. By virtue of the rigid mount which allows no movement between the component and the terminals to which the leads are attached, the component and the leads vibrate in unison in response to the vibratory oscillations of the support structure. This prevents embrittlement and resulting failure of the component leads. An additional feature of the clamp is its metallic construction which provides a heat sink and facilitates the transfer of heat away from the component.

It should be understood that the invention is not limited to the particular embodiment shown and described herein, but that various changes and modifications may be made without departing from the spirit or scope of this concept as defined by the following claims.

We claim:

1. A clamp for an electrical component comprising a bottom plate, a pair of L-shaped end brackets each having a base portion and an upright portion and a top plate, said end brackets being attached by their base portions to said bottom plate and said top plate being attached to said upright portion of said end brackets, said bottom plate having a V-shaped channel extending along a midportion of its upper face, said top plate having a V-shaped channel extending along a midportion of its lower face and opposite said bottom plate channel, terminal means on said base portion of said end brackets, said end bracket upright portions having an aperture therein through which electrical component leads may be connected to said terminal means.

2. An electrical component clamp in accordance with claim 1 in which said terminal means is attached to each said end bracket base portion by the same attachment of said end brackets to said bottom plate.

3. An electrical component clamp in accordance with claim 1 in which said end bracket apertures are sized to preclude electrical contact with component leads.

4. An electrical component clamp in accordance with claim 1 in which said bottom plate, end brackets or top plate is metallic to provide a heat sink.

* * * * *